United States Patent [19]

DeClue et al.

[11] 3,937,988
[45] Feb. 10, 1976

[54] ACTIVE TERMINATION NETWORK FOR CLAMPING A LINE SIGNAL

[75] Inventors: Larry W. DeClue, San Jose; Harold H. Muller, Mountain View, both of Calif.

[73] Assignee: Fairchild Camera and Instrument Corporation, Mountain View, Calif.

[22] Filed: Apr. 5, 1974

[21] Appl. No.: 458,151

[52] U.S. Cl. ............ 307/237; 307/297; 307/299 A; 307/313
[51] Int. Cl.² .......................................... H03K 5/08
[58] Field of Search .......... 307/208, 237, 297, 313, 307/299 A

[56] References Cited
UNITED STATES PATENTS

| | | | |
|---|---|---|---|
| 2,980,806 | 4/1961 | Ort................................ | 307/237 X |
| 3,246,080 | 4/1966 | Ritchey, Jr..................... | 307/237 X |
| 3,466,463 | 9/1969 | Moses............................. | 307/237 |

*Primary Examiner*—John Zazworsky
*Attorney, Agent, or Firm*—Alan H. MacPherson; J. Ronald Richbourg

[57] ABSTRACT

An active termination network for clamping a line signal near the receiving end of a data path. The termination network comprises an NPN transistor, a PNP transistor, the emitter electrodes of the transistors being coupled together to form an input terminal which is connected to the data path, a first bias source for biasing the base of the NPN transistor such that the NPN transistor is caused to turn on when the line signal is below a low state, a second bias source for biasing the PNP transistor such that the PNP transistor is caused to turn on when the line signal is above a high state, a third bias source biasing the collector of the NPN transistor at ground, and a fourth bias source for biasing the collector of the PNP transistor with a negative voltage such that when the line signal fluctuates, the PNP and NPN transistors selectively turn on so as to appropriately clamp the line signal at the high and the low states so as to dissipate ringing energy and thus prevent the detrimental undershoot toward the threshold level. This network lends itself for usage in ECL circuits in which the logic states have a peak-to-peak amplitude of about one volt. In the preferred embodiment the first and second bias sources are developed from a temperature and voltage compensating network connected between the third and fourth bias sources.

9 Claims, 5 Drawing Figures

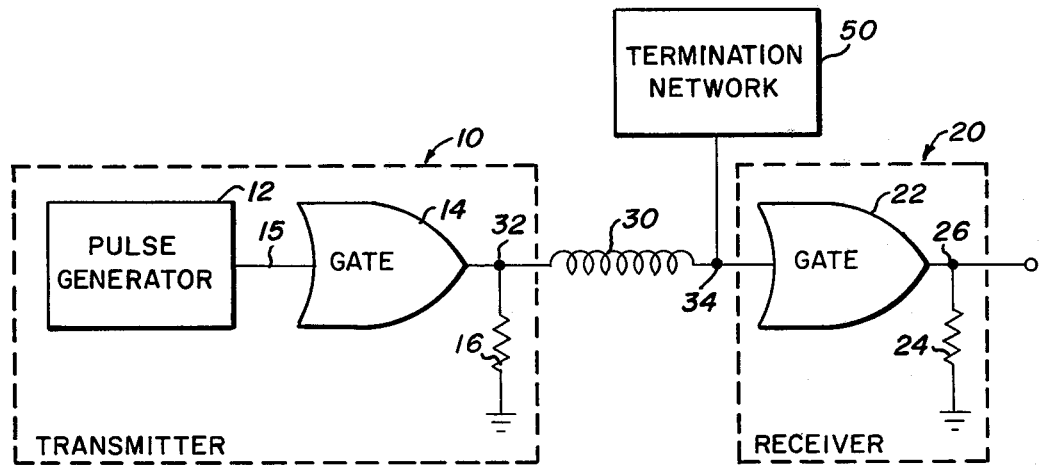
Fig_1
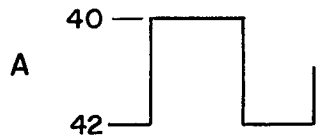
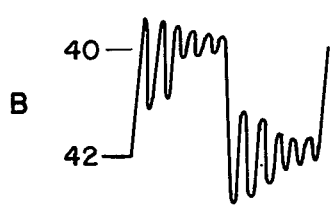
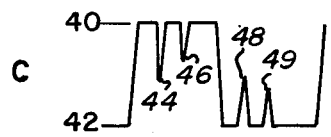
Fig_2
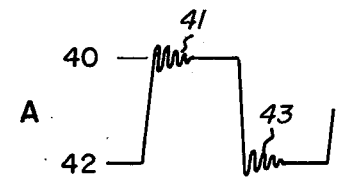
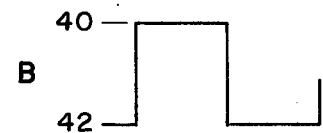
Fig_3
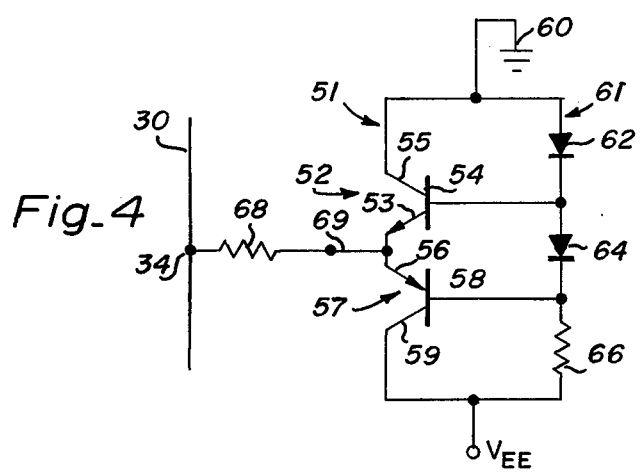
Fig_4

ACTIVE TERMINATION NETWORK FOR CLAMPING A LINE SIGNAL

BACKGROUND OF THE INVENTION

1. Field of the Invention

This invention relates to a termination network for clamping line signals to a low and a high logic state and, in particular, to such a network which comprises an NPN and PNP transistor pair that are biased so as to selectively turn on when the line signal fluctuates below the low state and above the high state.

2. Description of the Prior Art

In electronic circuitry comprised of several discrete integrated circuits which are interconnected by conductors, it is important that the circuitry be capable of providing predictable and constant logic signals under all adverse conditions so as to provide a sufficient worst case level of noise immunity. However, even though care is exercised in fabricating and designing the circuits themselves, many times the received logic signal is not representative of that transmitted due to electrical noise and to the electrical parameters of the conductor itself. In general, there will be a mismatch on both the transmitting and the receiving ends of the conductor, causing reflections, which superimpose as noise, on the date being transmitted. For example, noise may superimpose spikes on the logic signal and inductance inherently associated with the actual conductor may introduce ringing oscillations on the logic signal. If the amplitude of the noise spike or ring is appreciable with respect to the amplitude of the logic signal, then the receiving logic may interpret each spike or ring as a logic pulse. Generally, incorrect interpretations cause malfunctions in the operation of the host system which could be of catastrophic proportions. The probabilities of malfunction are substantially increased when emitter-coupled logic (ECL) is used since ECL logic pulses have only about a one volt peak-to-peak amplitude as well as relatively high slew rates between the high and low states. In addition, the detrimental effect of randon noise pulses superimposed on transmitted data increases with an increase in the data rate of the transmission. At the present state of the art, ECL circuitry provides the fastest means for data transmission.

In the prior art, termination networks have been used near the receiving end of a data path to remove the noise and ringing effects from appearing at the receiver. In one terminating system, a network is connected to the line conductor. The network includes a pair of Schottky diodes, an inverter gate, a load resistor and two bias sources. One of the bias sources is ground and the other one is a negative voltage. The Schottky diodes are connected in parallel in a back-to-back arrangement between the line conductor and the inverter gate. The input and the output of the inverter gate are connected together. The resistor is connected between the output-input feedback of the inverter gate and the negative bias source. This arrangement sets a reference voltage at the center of the ECL logic swing (center between logic 1 and logic 0). Due to the fact that a Schottky diode base-emitter forward voltage equals approximately half the ECL logic swing, the network operatively clamps the voltages of the logic signals appearing on the line conductor which are above or below the base-emitter forward voltage of the Schottky diodes, i.e., above and below the logic 1 and logic 0 state, respectively. However, several problems have been found in the use of such a network. First, if the dc level of the high state of the line signal is above the threshold of one of the Schottky diodes, the signal remains clamped for the duration of the high state, thus causing a large and constant current through the load resistor. This load resistor, therefore, needs to be dimensioned such that it will sink the worst-case current supplied through the terminals. The requirement for this relatively high stand-by current is the major drawback of this implementation. Second, the threshold voltage of a Schottky diode varies substantially with changes in temperature. For example, at room temperature a Schottky diode may have a 0.5 volt threshold whereas at colder temperatures the threshold may be 0.7 volts, and at hot temperatures the threshold may be 0.3 volts. Accordingly, the clamping signal would vary with temperature from between 0.6 volts to 1.4 volts peak to peak. Thus, in cold environments ringing pulses having an amplitude comparable to that of the logic signal levels could be conducted into the receiver and in hot environments excessive current could be drawn through the load resistor. Third, since two Schottky diodes are required for each data line and a resistor and an inverter gate are required to set the threshold voltage, the expense of such a network for terminating a multiplicity of data lines would be substantial.

SUMMARY OF THE PRESENT INVENTION

Briefly, the present invention is directed toward an active termination network for clamping a line signal near the receiving portion of a data conductor, the line signal having a high state and a low state and being susceptible to noise which causes the line signal to undesirably fluctuate about the high state and the low state. The network includes an NPN transistor having a first emitter, a first base and a first collector, a PNP transistor having a second emitter, a second base and a second collector, the first and second emitters being coupled together to form an input terminal which is connected to the data conductor near the receiving portion, first means for biasing the first base with a first reference bias potential such that the NPN transistor is caused to turn on when the line signal is below the low state, second means for biasing the second base with a second reference bias potential such that the PNP transistor is caused to turn on when the line signal is above the high state, third means for biasing the first collector at a third reference potential, and fourth means for biasing the second collector at a fourth reference potential that is relatively negative with respect to the third reference potential, such that when the line signal fluctuates above the high state, the PNP transistor turns on so as to clamp the line signal to the high state, and when the line signal fluctuates below the low state, the NPN transistor turns on so as to clamp the line signal to the low state. In these cases the overshoot energy is dissipated so as to avoid the following detrimental undershoot. In one embodiment, the bias network coupled between the third and fourth reference potentials comprises a pair of serially-connected diodes.

In another embodiment a temperature compensated voltage regulating circuit is connected between the third and fourth bias means so as to apply substantially voltage compensated bias potentials to the bases of the respective NPN and PNP transistors, and to apply bias potentials of the proper temperature tracking to the respective NPN and PNP transistors so as to temperature compensate the output. Voltage compensation refers to invariance of the bias potential with respect to the third bias source.

One advantage of the present invention is that it requires very little stand-by as well as system operation power.

Another advantage of the present invention is that it is used to terminate a plurality of data conductors.

Still another advantage of the present invention is that it lends itself to terminating rack-mounted ECL prototype logic circuits where the transmitter is physically separated from the receiver. This advantage is especially important in high frequency applications.

Other advantages will be apparent to those skilled in the art after having read the following detailed disclosure which makes reference to the several figures of the drawings.

IN THE DRAWINGS

FIG. 1 is a circuit diagram of a system, in block diagram form, employing the active termination network of the present invention.

FIG. 2 is a series of wave forms representative of signals appearing in the system of FIG. 1 when the active termination network is not employed.

FIG. 3 is a series of wave forms representative of the signals appearing in the system of FIG. 1 when the active termination network of the present invention is employed.

FIG. 4 is a schematic circuit diagram of a simplified embodiment of the present invention.

DETAILED DESCRIPTION OF THE PREFERRED EMBODIMENT

Figure 5:
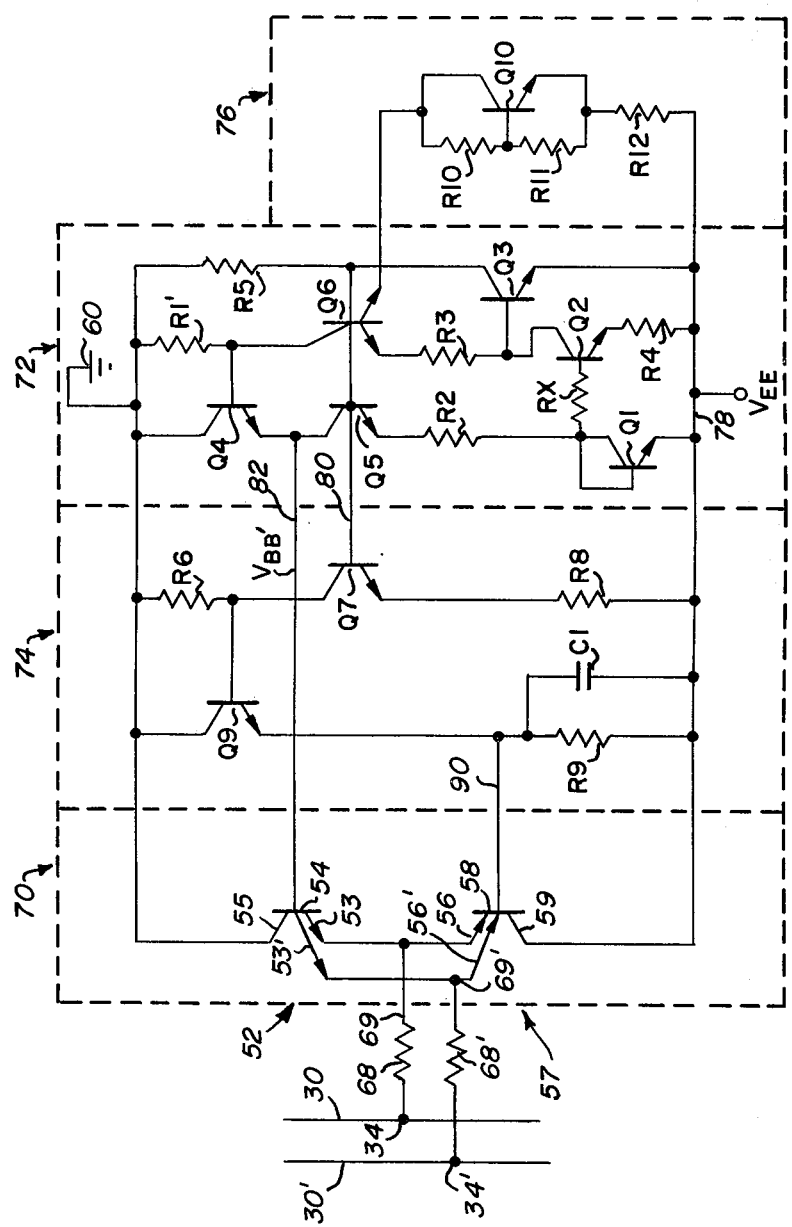
FIG. 5 is a schematic circuit diagram of a second embodiment of the present invention which is operative uniformly over a range of temperatures and supply voltage.

Referring now to the drawings, and in particular to FIG. 1, a logic system is illustrated in block diagram form. As shown therein, the system comprises a transmitter, generally designated by the numeral 10, a conductor 30, which has one terminal 32 connected to the output of the transmitter 10 and another terminal 34 connected to the input of the receiver 20, and a termination network 50 which is connected to the conductor 30 near, or at, the terminal 34 at the receiving portion of the system.

The transmitter 10 comprises a pulse generator 12, a logic gate 14 that is serially connected to the pulse generator 12 with a conductor 15, and a load resistor 16. The pulse generator supplies a train of square wave pulses, one of which is illustrated in FIG. 2A, to a gate 14 which in turn gates the pulses in a preselected code so as to provide information in the form of a line signal comprising a plurality of logic pulses on the conductor 30. Each of the logic pulses includes a high state 40 and a low state 42. The conductor 30 is schematically represented as being an inductor since it is well known in the art that conductors inherently have inductive properties. Moreover, as frequency increases the inductive impedance of the conductor increases, and as the length of the conductor increases, it tends to act as an antenna and as such, it is quite susceptible to picking up or emitting spurious radiation. Accordingly, electrical noise and the well-known ringing oscillations are superimposed on high frequency pulses traveling down the lengths of the conductor. In addition, impedance mismatches on both the receiving and the driving source versus the conductor impedance cause reflections at those nodes which superimpose noise on the transmitted data. The receiver 20, which is connected to the terminal 34 of conductor 30, comprises a logic gate 22 and a load resistor 24. The output signal of the receiver appears across the resistor 24 at the node 26.

FIG. 2B represents the signal at the input of gate 22 when the square wave of FIG. 2A is applied to conductor 30 by the pulse generator 12 when no termination network is provided in the logic system. As illustrated, the signal of FIG. 2B includes a pronounced ringing effect at each transistion between the high and the low states. The output signal appearing at node 26 is illustrated in FIG. 2C after being received by the gate 22. As shown, each undershoot of the ringing oscillation below the high logic state 40 and each overshoot above the low logic state 42 which approaches the input threshold of gate 22 would be interpreted by the gate as an additional input pulse. Accordingly, the output signal would include additional pulses 44 and 46 caused by the ringing oscillation associated with high logic state 40 and pulses 48 and 49 caused by ringing oscillations associated with the low logic state 42 which have a sufficient amplitude so as to be interpreted by pulse counting circuitry (not shown) as additional pulses. It is obvious that the additional pulses introduced by the conductor create a received logic pattern which is substantially different than that transmitted. Accordingly, the termination network 50 of the present invention is connected to the logic system to clamp the line signal on the data-carrying conductor 30 so as to prevent fluctuations in the line signal from producing incorrect information at the receiver 20.

Referring to FIG. 4, a first simplified embodiment of the termination network of the present invention is illustrated. The network includes an active branch 51 for clamping the line signal and a bias circuit 61 for applying the preselected bias potentials to the active elements of branch 51. The active branch 51 includes a NPN transistor 52, which includes an emitter electrode 53, a base electrode 54 and a collector electrode 55, and a PNP transistor 57, which includes an emitter electrode 56, a base electrode 58 and a collector electrode 59. The emitter 53 is connected to the emitter 56 so as to form a terminal 69. A current limiting resistor 68 is connected between terminal 69 and the input terminal 34 of the conductor 30. The collector 55 of the NPN transistor 52 is connected to a bias potential, which is preferably ground and is represented by the numeral 60. The collector 59 of the PNP transistor 57 is connected to a negative reference bias source, $V_{EE}$, which is negative with respect to ground 60. A bias circuit 61 is serially connected between ground and the negative bias, $V_{EE}$. The bias circuit 61 includes two unidirectional current conduction devices, such as diodes 62 and 64, and a resistor 66 which are serially connected between ground 60 and the negative supply, $V_{EE}$. Accordingly, substantially constant voltages with respect to variations of $V_{EE}$ are developed at the cathodes of diodes 62 and 64. The cathode of diode 62 is connected to base 54 of the NPN transistor 52 and the cathode of diode 64 is connected to the base 58 of the PNP transistor 57.

In the preferred embodiment, the negative bias potential $V_{EE}$ has a magnitude of 5.2 volts so as to forward bias the diodes 62 and 64, and to produce a voltage drop across diode 62 of about 0.8 volts, and across diode 64 of about 0.8 volts. The NPN transistor 52 and the PNP transistor 57 are chosen to have substantially matched characteristics so as to have equal base-to-emitter voltage drops when the transistors are on and to have a beta ($\beta$) parameter which is approximately equal to but not less than 50. It is noted that beta is recognized by those skilled in the art as being the ratio of the collector current to the emitter current in a transistor.

In the following description it should be noted that the ECL signal appearing on the conductor 30 at the input terminal 34 of the termination network will be considered to have a high state when its value is −0.850 volts and to have a low state when its value is −1.75 volts. The characteristics of the diodes 62 and 64 are chosen such that when a logic signal in the high state is applied to the input of the termination network, the NPN transistor 52 is turned off and the PNP transistor 57 is biased so as to be slightly conductive. Accordingly, when the voltage of the line signal fluctuates above the high state level, the base to emitter junction of the transistor 57 becomes forward biased, turning on the transistor so as to clamp the line signal at the high level. However, when the voltage of the line signal at node 69 drops below the high state, the base-to-emitter voltage is insufficient to maintain conduction of the PNP transistor, whereby transistor 57 turns off. Since the NPN transistor 52 is already turned off, the active termination network has no effect on signals appearing at the input of receiver 20 until the line signal drops below the low state. When this occurs, in a manner similar to that described above, the NPN transistor 52 turns on so as to clamp the line signal at the low state. Current limiting resistor 68 serves to match the impedance between the conductor and the receiving point at a current level which does not exceed the power rating of the termination network.

The effect of including the termination network 50 of the present invention in a logic system is illustrated in FIG. 3. FIG. 3A illustrates the wave form of the line signal applied to gate 22 when the termination network is connected at the receiving end of an ECL transmission system. As shown, the wave form is similar in shape to the pulse generated by the pulse generator, differing only by the very small noise bursts 41 and 43 on the high and low logic levels, respectively. Most importantly, all ringing is substantially eliminated. FIG. 3B illustrates the wave form of the signal appearing at node 26 which is seen to be substantially similar in shape to the generated pulse and which does not include the noise bursts which were present prior to the application of the termination network to the input of the gate 22.

Referring now to FIG. 5, a second embodiment of the termination network formed in accordance with the present invention is illustrated in a schematic circuit diagram. Although the various elements are shown in the form of discrete classical electrical components, it will be appreciated that these elements are only representative of the electrical characteristics exhibited by various integrated circuit components and that the termination network is preferably fabricated as an integrated circuit.

The termination network 50 comprises an active clamping network 70, and a bias circuit which includes a circuit, generally designated by the numeral 72, for developing a pair of reference signals which are voltage compensated and have the proper temperature gradient so as to compensate the terminal 34 and adjustment circuits 74 and 76 for developing voltage compensated and temperature compensating bias signals from the respective reference signals for application to the active elements of the active clamping network.

The fundamental difference between the bias circuit of FIG. 5 and the bias circuit of FIG. 4, which is described above, is that in the bias circuit of FIG. 5 the reference bias signals applied to the bases of the NPN and PNP transistors are voltage compensated such that they are substantially independent of changes in the supply voltage and have the proper temperature gradient so as to compensate the terminal 34 for variations in the ambient temperature or semiconductor parameters.

In the description that follows, with respect to components of the circuits 72, 74 and 76, a transistor is denoted by the letter Q followed by a number, transistors connected as diodes are designated by the letter Q followed by a number, a resistor by the letter R followed by a number, and other types of components by an identifying letter, such as C for a capacitor and D for a diode, followed by a number. Nodal points within the network are designated solely by a number.

The voltage and temperature compensated bias circuit 72 is substantially the same as that described in U.S. Pat. No. 3,781,648, entitled "Temperature Compensated Voltage Regulator Having Beta Compensating Means," invented by William K. Owens and assigned to the assignee of the present invention. Accordingly, certain details of construction and operation of the circuit 72 have been omitted in this specification since they are the same as disclosed in the above-referenced Owens patent and that patent is incorporated by reference to this specification for any details not disclosed herein. Many of the elements of the temperature compensated voltage regulator of the Owens patent are identical to like parts in the bias signal developing circuit 72 of the termination network of the present invention. Accordingly, there has been applied to each element of the circuit 72 a reference letter and numeral that corresponds to the reference letter and numeral applied to the like element in the Owens patent.

The active clamping network 70 comprises the same elements as the active branch 51, which has been previously described. Accordingly, the same reference numerals are applied to corresponding elements of the NPN transistor 52 and the PNP transistor 57.

The reference signal developing circuit 72, sometimes referred to as the regulator circuit or the bias driver, is provided with four external contact points including the node 60 to which the ground voltage is applied, a node 78 to which the negative supply voltage $V_{EE}$ is applied, and output terminals 80 and 82 from which the reference voltages may be taken. The circuit 72 includes a first branch which comprises a resistive impedance element represented by the resistor R2 and a unidirectional current conducting device such as the diode Q1, which are serially connected between the emitter of an NPN transistor Q5 and node 78. The base of Q5 is connected to the output terminal 80. The collector of Q5 is connected to the output terminal 82 and to the emitter of an NPN transistor Q4. The collector of Q4 is connected to ground 60. A second branch of the circuit 72 is similarly connected between ground 60 and the negative bias supply $V_{EE}$. The second branch comprises resistor R1', transistor Q6, resistor R3, transistor Q2 and resistor R4 which are serially connected. In one coupling connection the base of Q4 is connected to the junction between the resistor R1' and the collector of the NPN transistor Q6. The base of transistor Q5 is connected to the base of Q6, to resistor R5 and to the collector of an NPN transistor Q3 in a third branch of the circuit 72. The emitter of Q3 is connected to node 78. The transistor Q6 comprises two emitters. One of the emitters is connected through a resistive element R3 to the collector of transistor Q2. The emitter of Q2 is connected to one end of resistor R4. The other end of R4 is connected to node 78. Between the base of the transistor Q2 and the common collector and base terminals of diode Q1, a resistance RX is connected. A complete description of the method of choosing RX is contained in the Owens patent. The collector of Q2 is connected to the base of Q3. It should be noted that R1' is different from the resistor R1 described in the Owens patent and is chosen to compensate the additional base-emitter voltage introduced by the NPN transistor 52.

One of the features of the active termination network of this embodiment is the combination of the temperature compensated voltage regulator and the adjustment circuits 74 and 76 in an arrangement so as to provide predictable bias voltages on the respective bases of both the transistors 52 and 57, while maintaining terminal 34 in a temperature compensated condition. Because of the temperature dependency of the base to emitter junctions of the transistors 52 and 57, the Owens voltage regulator would not provide temperature compensation at the terminal 34.

The temperature and voltage compensated adjustment circuit 76 compensates for the temperature variation in the parameters of the NPN transistor 52 and includes an NPN transistor Q10, which is connected as a fractional diode. The collector of Q10 is connected to one of the emitters of Q6. The emitter of Q10 is connected to one end of a resistive element R12. The other end of R12 is connected to node 78. In the fractional diode a resistive element R10 is connected between the collector and the base of Q10, and a resistive element R11 is connected between the base and the emitter of Q10. In this configuration the current through R11 can be expressed as $$I_{R11} = \frac{V_{BE}}{R11}$$

where $V_{BE}$ is the base-to-emitter voltage across that junction of Q10.

Transistor Q10 is chosen to have a beta of approximately 100 such that the current through R11 is approximately equal to that flowing through R10. Upon substitution of the above relationships, the following equation may be written:

$$V_{R10} = \frac{R10}{R11}(V_{BE})$$

Thus, the voltage across the transistor Q10 is proportional to the ratio of the resistance of R10 to that of R11.

Since the resistance R12 in the fractional diode branch draws current through Q6, the collector resistor R1' is chosen to translate the temperature compensating voltage developed across R12 to the base of Q4. The fractional diode circuit must be included to compensate for the introduction of the NPN transistor 52 since it translates to R1' a temperature dependence in the opposite direction to that attributed to the base-to-emitter junction of transistor 52. Accordingly, a reference bias potential, designated $V_{BB}$, is provided on terminal 82 to the base 54 of the NPN clamping transistor 52 which is voltage compensated. In addition, the effects of temperature variations of the NPN transistor 52 on the termination network are compensated for at the input to the data conductor 30.

The adjustment circuit 74 compensates for temperature variations due to the introduction of the PNP transistor 57. Circuit 74 is coupled between the terminal 80 and the terminal 90 and comprises transistors Q7 and Q9 along with the appropriate resistors and capacitor. The base of Q7 is connected to terminal 80. A bias resistor R6 is connected from ground 60 to the collector of Q7 and to the base of Q9. The emitter of Q7 is connected to the negative supply voltage $V_{EE}$ through bias resistor R8. The emitter of Q9 is connected to the negative supply voltage $V_{EE}$ through a load impedance, which includes the parallel combination of load resistor R9 and a filter capacitor C1, and to the base driving terminal 90. In this arrangement the transistor Q9 is matched to transistor 57 and also provides beta isolation to R6. The load resistor R9 is chosen to assure that the current flowing therethrough is substantially independent of the conduction state of the PNP transistor 57. The filter capacitor C1 damps the base 58 to prevent transients at one terminal (terminal 34) from causing glitches on other terminals (terminal 34') which would otherwise result due to beta loading of the terminal 90 by an emitter of the PNP transistor 57 (emitter 56). The collector to base junction of Q7 is compensated for by the base-to-emitter junction of Q9. Accordingly, the voltage developed at terminal 90 is voltage compensated and the voltage on terminal 34 at the input of the network 50 is both temperature and voltage compensated.

In summary, the circuits 74 and 76 provide the adjustment necessary such that constant and predictable reference voltages are applied to the bases of the clamping transistors 57 and 52 respectively. In operation, the transistors 52 and 57 function as previously described such that the NPN transistor is caused to turn on when the line signal is below the low state and the PNP transistor is caused to turn on when the line signal is above the high state.

Another feature of the termination network of this invention is that it lends itself to terminating a plurality of data paths. In this embodiment the NPN transistor 52 and the PNP transistor 57 are fabricated with a plurality of emitters 53' and 56', respectively (as illustrated by the dashed lines in FIG. 5), and the corresponding pairs of emitters are connected together to one end 69' of a current limiting resistor 68'. The other end 34' of resistor 68' is then appropriately connected to a second data conductor 30'. In the preferred embodiment the transistors 52 and 57 include seven emitters so as to provide a termination network for seven different data paths.

In the preferred embodiment R1' is 135 ohms, R2 is 565 ohms, R3 is 550 ohms, R4 is 90 ohms, R5 is 3100 ohms, R6 is 1534 ohms, R8 is 2684 ohms, R9 is 907 ohms, and RX is 525 ohms. $V_{EE}$ is 5.2 volts. The transistors Q3 and Q4 are matched as are the characteristics of the complementary transistor pairs 52 and 57, and Q9 and Q7.

From the above, it will be seen that there has been provided an active termination network for clamping line signals which fulfills all of the objects and advantages set forth above.

While there has been described what is at present considered to be the preferred embodiments of the invention, it will be understood that various modifications may be made therein, and it is intended to cover in the appended claims all such modifications as fall within the true spirit and scope of the invention.

What is claimed is:

1. An active termination network for clamping line signals near the receiving portions of a plurality of data paths, said line signals each having a high state and a low state and being susceptible to noise, which causes said line signals to undesirably fluctuate above said high state and below said low state, said network comprising:

NPN transistor means including a first plurality of emitter means, a first base and a first collector;

PNP transistor means including a second plurality of emitter means, a second base and a second collector, each of said first plurality of emitter means being coupled to corresponding ones of said second plurality of emitter means to form a plurality of input terminal means for said termination network, said plurality of input terminal means being disposed for connection to said plurality of data paths near said receiving portion;

first means for biasing said first base with a first reference bias potential such that said NPN transistor means is caused to turn on when said line signals are below said low state;

second means for biasing said second base with a second reference bias potential such that said PNP transistor means is caused to turn on when said line signals are above said high state;

third means for biasing said first collector at a third reference potential; and, fourth means for biasing said second collector at a fourth reference potential that is relatively negative with respect to said third reference potential, such that when said line signal fluctuates above said high state said PNP transistor means turns on so as to clamp each of said line signals to said high state, and when said line signals fluctuate below said low state said NPN transistor means turns on so as to clamp each of said line signals to said low state, wherein said first and second means for biasing include means responsive to said third and said fourth reference potentials and operative to provide said first and said second reference bias potentials which are voltage compensated with respect to said third reference potential such that each of said input terminal means is voltage and temperature compensated.

2. An active termination network as recited in claim 1 and further including second resistive means connected between said input terminal means and said coupled emitter means for limiting the current applied to said coupled emitter means.

3. An active termination network as recited in claim 1 and further including a plurality of current limiting resistive means connected between respective ones of said plurality of input terminal means and a corresponding data path.

4. An active termination network as recited in claim 1 wherein said first and second biasing means include a voltage regulating means and further comprising first temperature dependent means coupled to said voltage regulating means which has a temperature dependence in the opposite direction to that of said NPN transistor means so as to provide temperature compensation at said input terminal means.

5. An active termination network as recited in claim 4 wherein said first temperature dependent means includes a fractional diode means.

6. An active termination network as recited in claim 5 wherein said fractional diode means includes a second NPN transistor connected as a diode.

7. An active termination network as recited in claim 4, and further including second temperature dependent means coupled to said voltage regulating means which has a temperature dependence in the opposite direction of that of said PNP transistor means so as to provide temperature compensation at said input terminal means.

8. An active termination network as recited in claim 7 wherein said second temperature dependent means includes a third NPN transistor means arranged so that its base-to-emitter junction is connected in series with the base-to-emitter junction of said PNP transistor means.

9. An active termination network as recited in claim 7, including filter capacitor means coupled between said PNP transistor means and said second temperature dependent means for providing a substantially constant voltage at said second base that is substantially independent of the conduction state of said PNP transistor means.

* * * * *